United States Patent [19]

Tise

[11] Patent Number: 4,631,247

[45] Date of Patent: Dec. 23, 1986

[54] ACETYLENE COMPOUNDS AS SHELF LIFE IMPROVERS FOR PHOTORESIST COMPOSITIONS CONTAINING ORGANIC IODIDES

[75] Inventor: Frank P. Tise, Wilmington, Del.

[73] Assignee: Hercules Incorporated, Wilmington, Del.

[21] Appl. No.: 764,038

[22] Filed: Aug. 9, 1985

[51] Int. Cl.$^4$ ............................................. G03C 1/68
[52] U.S. Cl. ..................................... 430/281; 430/270; 430/925; 522/30; 522/67; 522/68; 522/69; 522/71; 522/184; 522/188
[58] Field of Search ................. 430/925, 270, 281; 522/30, 67, 68, 69, 71, 184, 188

[56] References Cited

U.S. PATENT DOCUMENTS

| | | | |
|---|---|---|---|
| 3,592,798 | 7/1971 | Oswald | 522/184 |
| 4,033,773 | 7/1977 | Lewis | 430/925 |
| 4,043,887 | 8/1977 | Pacifici et al. | 430/925 |
| 4,113,592 | 9/1978 | Rybny et al. | 430/925 |

*Primary Examiner*—Jack P. Brammer
*Attorney, Agent, or Firm*—William E. Player

[57] ABSTRACT

Disclosed are shelf life improvers for photoresist compositions containing organic halides as the photoinitiator that comprise an acetylene compound having the general formula $RC{\equiv}CR'$ where R and R' are each independently phenyl, hydrogen, benzyl, vinyl, lower alkyl substituted vinyl, phenyl substituted vinyl, lower alkoxy methyl and phenoxymethyl.

8 Claims, No Drawings

ACETYLENE COMPOUNDS AS SHELF LIFE IMPROVERS FOR PHOTORESIST COMPOSITIONS CONTAINING ORGANIC IODIDES

BACKGROUND OF THE INVENTION

This invention relates to photopolymerizable compositions used in the manufacture of photoresists. More particularly, it relates to the photoresist compositions in which organic halides are the photoreactive species, i.e., photoinitiators.

Organic halides when used as the photoreactive species in photoresist compositions have a tendency to autodecompose, resulting in premature polymerization of the composition. Prematurely polymerized compositions make photoresists of inferior quality. Improving the shelf life of the compositions by reducing premature polymerization without interfering with photopolymerization during resist manufacture would permit longer storage times and reduce or eliminate the added costs resulting from spoilage.

SUMMARY OF THE INVENTION

According to the invention, a photoresist composition containing an organic halide as the photoinitiator therein and having improved shelf life is characterized in that the composition further comprises an acetylene compound having the general formula $RC\equiv CR'$ where R and R' are each independently phenyl, hydrogen, benzyl, vinyl, lower alkyl substituted vinyl, phenyl substituted vinyl, lower alkoxy methyl and phenoxymethyl.

DETAILED DESCRIPTION OF THE INVENTION

Typical of the acetylene compounds useable in accordance with this invention are methyl-2-propynyl ether, 3-methyl-3-butenyne, phenyl acetylene, diphenyl acetylene, benzyl acetylene, vinyl acetylene, 1-phenylethenyl acetylene, methoxymethyl acetylene, and phenoxymethyl acetylene.

The acetylene compounds prevent premature polymerization in organic halide-containing photoresist compositions, while being removable to permit desired polymerization. The removal is accomplished by heating to a temperature sufficient to bake out the compounds and can be done without damaging the other photoresist components due to the relatively high volatility of the acetylenes, i.e., in a given composition, the acetylene used is more volatile than the other components of the given composition.

The photoresist compositions to which this invention applies comprise, essentially, at least one monomer that is capable of polymerization by the photo-decomposition of an organic-halide, an organic halide photoinitiator, a polymeric binder and a solvent.

Typical monomers are, for example, heterocyclic and aromatic N-vinyl amines, such as N-vinylindole, N-vinylcarbazole, N-vinylphenyl-alpha-naphthylamine, N-vinylpyrrole, N-vinyldiphenylamine (stabilized with 0.1% cyclohexylamine) 3,6-dimethyl-N-vinylcarbazole, 3-(2 hydroxy-1-naphthazo)-9-vinylcarbazole, 3-(9' xanthyl)-9-vinylcarbazole, 9-vinyl-(2'3':3,4,)-napthcarbazole, 9-vinyl-3-(p-hydroxyaniline)-carbazole, 3-indole-phenol-9-vinylcarbazole, and 3-indole-phenol azo-9-vinylcarbazole. Other monomers usable in accordance with this invention will be apparent to those skilled in the art.

Typical organic halides are organic bromides and iodides, such as, for example, tetraiodoethylene, tetrabromoethylene, iodocyclohexane, bromocyclohexane, phenyl-1,2,2-tri-iodoethylene, phenyl-1,2,2-tribromoethylene, 1-iodoeicosane, 1-bromoeicosane, 2-iodoeicosane, 2-bromoeicosane, iodobenzene, bromobenzene, iodonapthalene, bromonaphthalene, iodoanthracene, bromoanthracene, E-2,3-diiodobutenediol, E-alpha, $\beta$-diiodocinnamic acid, E-alpha,alpha'-diiodostilbene, E-alpha,alpha'-dibromostilbene, benzyl bromide, benzyl iodide, allyl bromide, and allyl iodide. Other organic halides useful herein will be apparent to those skilled in the art.

Typical polymeric binders are, for example, polyvinyl butyral, vinyl alcohol-vinyl acetate copolymer, vinylchloride-vinyl-acetate copolymer, poly(vinylpropionate), poly(vinylbutyrate), copolymer of polystyrene and polyvinylketone, and poly(vinylketone). Other binders useful herein will be apparent to those skilled in the art.

Typical organic solvents are alcohols, glycols, cellosolves, chlorinated solvents, hydrocarbons, amine type solvents, ethers, ketones, esters, and others that will be apparent to those skilled in the art.

Optionally, the photoresist compositions contain stabilizers, photosensitizers, pigments, etc., which will be apparent to those skilled in the art.

The amount of the acetylene compound added to the photosensitive compositions varies, based on the total weight of the composition, from about 0.1% to about 10%, preferably from about 1% to about 5%.

The acetylene compounds can be combined with the other components of the photosensitive compositions in any manner that permits these compounds to be evenly distributed throughout the composition. Typically, this is done by tumbling the photoresist composition components for several hours. Other methods will be apparent to those skilled in the art.

The particular acetylene compound used in a given photoresist composition must be sufficiently more volatile than the other components of the composition, such that the compound can be removed by heating the composition (i.e., the compound is baked out) without appreciably removing or degrading the other components.

The photoresist compositions of this invention are used to make photoresists such as employed in the manufacture of printed and integrated circuits, where the photoresist compositions are coated onto substrates, exposed imagewise to radiation, and then developed to remove the unexposed photoresist composition, leaving a photoresist image on the substrate. Various substrates are usable that will be apparent to those skilled in the art. Typical substrates are silicon, copper, and aluminum.

The compositions are coated onto the substrates by either applying the composition and then heating it to remove the solvent (called soft baking), or first removing the solvent and then applying the dry composition to the substrate. Methods for applying the dry compositions onto the substrates will be apparent to those skilled in the art.

Before the compositions are exposed to actinic radiation, the acetylene compounds are removed. This is done by heating the composition to a temperature and for a time such that enough of the compounds are removed, so as not to interfere with the photopolymerization of the monomers during exposure, without appreciably removing or degrading the other composition components, except the solvent. The acetylenes can be conveniently removed along with the solvent during soft baking. The exact time and temperature used will depend on the acetylene compound used and the other photoresist components used. Generally, the temperature will vary from about 40° C. to about 100° C., and the time will vary from about 2 minutes to about 10 minutes.

Exposure techniques will be apparent to those skilled in the art. Generally, the compositions are exposed to electromagnetic radiation having a wavelength of about 200-450 n.m, with an intensity and duration dependent on the photoresist components used, and which will be apparent to those skilled in the art.

Wet or dry development techniques known to those skilled in the art are used in accordance with this invention, and the specific technique used will depend on the specific photoresist components used.

The following examples more fully explain this invention. They are illustrative only and the instant invention is not limited thereto. All parts and percentages are by weight unless indicated otherwise.

EXAMPLE 1

A photoresist is prepared from a composition using methyl-2-propynyl ether to improve its shelf life. The composition is prepared containing 0.4 parts of methyl-3-propynyl ether, 0.125 parts of alpha, beta, beta-triiodostyrene as a photoinitiator, 1.65 parts of polyvinyl formal as a polymeric binder, 0.812 parts of N-vinylcarbazole as a polymerizable monomer, 0.05 parts of perylene as a photosensitizer, and 0.05 parts of 2,6-di-tert-butyl-4-methylphenol as a stabilizer, and as a solvent, 15.92 parts of chlorobenzene and 3.98 parts of n-butanol, the ingredients being mixed by tumbling overnight. This and all subsequent operations are performed under yellow light.

After seven days of accelerated aging in a 65° C. oven (estimated to be equivalent to fourteen months at room temperature), a 3" silicon wafer is coated with a few milliliters of the composition using a Photo-Resist Spinner, and spun for thirty seconds at 5500 rpm. The coated wafer is placed on a 5.5"×8" 12 gauge aluminum tray, which is placed on a heat sink in the bottom of a horizontal airflow mechanical convection oven for five minutes. The oven temperature is 65° C., with an airflow of 16.7 cubic feet/minute. The wafer is allowed to cool, and the coating is scratched with a No. 16 X-Acto blade. A coating thickness of 10200 Angstroms is measured at this scratch, using a Alpha-Step Profiler having a stylus radius of 12.5 micrometers and a stylus force of 15 mg.

The wafer is exposed for fourteen seconds on a Wafer Alignment System equipped with a mercury lamp, through a 436-nm bandpass filter and a multi-density photomask. A light intensity of 2.0 mW/square centimeter is measured at the exposure plane, using an IL 440 Photoresist Radiometer. The wafer is then baked for five minutes using the same equipment as in the above-mentioned 65° C. bake, except that the tray is rested on a 6"×8"×¼" aluminum plate in a 110° C. oven having an air flow of 10 cubic feet/minute.

Upon scratching and measuring as above, the 50 micrometer exposed line in the 30% transmission region of the wafer is examined. The "relief", or thickness differential between the coating on the exposed line and the adjacent unexposed area, is 4000 Angstroms.

The wafer is then developed in a parallel plate plasma unit using a 1-torr atmosphere of 1:1 oxygen/argon, a radio frequency energy density of 0.2 W/square centimeter, and a platen temperature of 40±0.1° C. Temperature is regulated by an Immersion and Suspension Controller. After one 6½ minute and two ½ minute plasma treatments, the unexposed areas of the wafer show no remaining photoresist, while the 50 micrometer exposed line has a retained thickness of 8000 Angstroms.

A photoresist is prepared and tested under the same conditions as above, but without having aged the composition prior to coating the wafer. Figures of 3200 and 6600 Angstroms are obtained for the relief and retained thickness, respectively. The results are summarized in the Table following Examples 2 and 3.

EXAMPLES 2 and 3

Photoresist compositions are prepared as in Example 1 using
0.25 parts alpha,beta,beta-triiodostyrene,
3.3 parts polyvinyl formal,
1.62 parts N-vinylcarbazole,
0.10 parts perylene,
0.10 parts - 2,6-di-tert-butyl-4-methylphenol,
35.04 parts - chlorobenzene, and
8.76 parts N-butanol.

In Example 2, 0.8 parts phenylacetylene are used as the shelf life improver, and in Example 3, 1.1 parts 3-methyl-3-butenyne are used. A control is prepared using no shelf life improver.

Photoresists are prepared from the compositions and tested as in Example 1, with the exception that plasma development is for only one 6½ minute period. Results are summarized in the Table below.

TABLE

| Sample | Relief (Angstroms) | | Retained Thickness (Angstroms) | |
|---|---|---|---|---|
| | Before Aging | After Aging | Before Aging | After Aging |
| Example 1 | 3,200 | 4,000 | 6,600 | 8,000 |
| Example 2 | 3,500 | 3,640 | 6,700 | 6,900 |
| Example 3 | 3,470 | 3,410 | 6,700 | 7,070 |
| Control | 4,700 | 1,150 | 7,250 | 2,000 |

The data collected in the Table shows that aging the photoresist compositions of this invention does not deteriorate the relief and retained thickness of the photoresist image obtained, while the image prepared from the aged control composition shows marked deterioration in retained thickness and in relief when compared with the image prepared from the non-aged control.

I claim:
1. A photoresist composition comprising:
   (a) at least one monomer capable of polymerization by photo-decomposition of an organic halide;
   (b) an organic halide photoinitiator;
   (c) a polymeric binder;
   (d) about 0.1% to about 10%, based on the weight of the compositon, of an acetylene compound having the general formula RC≡CR' where R and R' are each indepedently phenyl, hydrogen, benzyl, vinyl, lower alkyl substituted vinyl, phenyl substituted vinyl, lower alkoxy methyl and phenoxymethyl; and
   (e) a solvent.

2. The photoresist composition of claim 1, wherein the monomer is a vinyl carbazole.

3. The photoresist composition of claim 1, wherein the organic halide is tetraiodoethylene.

4. The photoresist composition of claim 1, wherein the polymeric binder is selected from the group consisting of polyvinyl butyral vinyl alcohol-vinyl acetate copolymer, vinylchloride-vinyl-acetate copolymer, poly-(vinylpropionate), poly(vinylbutyrate), a copolymer of polystyrene and polyvinylketone, and poly(vinylketone).

5. The photoresist composition of claim 1, wherein the acetylene compound is selected from the group consisting of methyl-2-propynyl ether, 3-methyl-3-butenyne, phenyl acetylene, diphenyl acetylene, benzyl acteylene, vinyl acetylene, 1-phenylethenyl acetylene, methoxymethyl acetylene, and phenoxymethyl acetylene.

6. The photoresist composition of claim 5, wherein the acetylene compound is methyl-2-propynyl ether.

7. The photoresist composition of claim 5, wherein the acetylene compound is phenylacetylene.

8. A method for improving the shelf life of a photoresist composition containing an organic halide as the photoinitiator, a polymeric binder, at least one monomer capable of polymerization by photodecomposition of an organic halide, and a solvent comprising combining the composition with about 0.1% to about 10%, based on the total weight of the composition, of an acetylene compound having the general formula $RC\equiv CR'$, where R and R' are each indepedently phenyl, hydrogen, benzyl, vinyl, lower alkyl substituted vinyl, phenyl substituted vinyl, lower alkoxy methyl and phenoxymethyl.

* * * * *